CAPACITOR COUPLED FEEDBACK AMPLIFIER

Filed Nov. 8, 1963

INVENTOR
V. R. SAARI
BY Leonard J. Arnold
ATTORNEY

United States Patent Office 3,260,950

Patented July 12, 1966

3,260,950

CAPACITOR COUPLED FEEDBACK AMPLIFIER

Veikko R. Saari, Murray Hill, N.J., assignor to Bell Telephone Laboratories, Incorporated, New York, N.Y., a corporation of New York Filed Nov. 8, 1963, Ser. No. 322,352
6 Claims. (Cl. 330—28)

This invention relates to feedback amplifiers and more particularly to negative feedback amplifiers whose gain extends to very low frequencies but whose input and/or output terminals are blocked to the flow of direct current.

In the design of negative feedback amplifiers it is often necessary to design an amplifier whose gain extends from very low frequencies to very high frequencies, for example, from two cycles per second to six megacycles per second. To achieve such low frequency response militates against the use of capacitor coupling between the input signal source and the amplifier and between the amplifier and the load. However, if the direct current level of the signal to be amplified is different from the direct current level of the amplifier input terminal or the direct current level of the last stage of the amplifier is different from that of the load, capacitor coupling must be employed to impede the flow of direct current. Thus two conflicting requirements must be met; providing gain at very low frequencies, and blocking the flow of direct current. To accomplish this result very large input and output capacitors having low capacitive reactance at low frequencies have been employed in the prior art to couple the signal source to the amplifier and the amplifier to the load. The low capacitive reactance of these large coupling capacitors at low frequencies enables the amplifier to provide gain at frequencies close to zero while at the same time blocking the flow of direct current.

It is an object of this invention to eliminate the need for such large coupling capacitors in negative feedback amplifiers having a very low frequency response and whose input and/or output terminals are blocked to the flow of direct current.

It is a related object of this invention to increase the effectiveness of coupling capacitors in such amplifiers.

It is a further object of this invention to substantially reduce the total physical size and weight of such amplifiers, and to reduce their cost.

In accordance with this invention the feedback network and the amplifier, or active path of the feedback loop, are each connected to the signal source and/or the load by means of a capacitor. Since both these capacitors are included in the feedback loop of the amplifier their capacitive reactance substantially decreases the feedback fraction, $\beta$, at low frequencies as compared to the feedback fraction of the prior art amplifier, where the feedback network is directly connected across the amplifier. This decrease in the feedback fraction, $\beta$, at low frequencies substantially boosts the gain at low frequencies compared with the prior art amplifier, and as a result an amplifier built in accordance with this invention does not require large capacitors in order to produce comparable gain at low frequencies. In applications where direct current feedback is required or is desirable in order to maintain bias stability, the signal source and/or the load are connected to the feedback amplifier by means of a $\Delta$ network of two capacitors and a resistor. The resulting circuitry similarly eliminates the need for large capacitors.

This invention will be more fully comprehended from the following detailed description taken in conjunction with the drawings in which.

Figure 1:
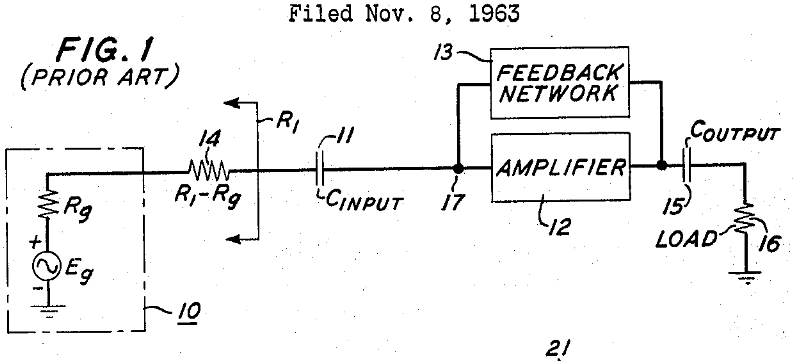
FIG. 1 (PRIOR ART)
FIG. 1 is a block diagram of the circuitry employed in the prior art.

A block diagram of the prior art circuit is shown in FIG. 1. An input signal source 10 having an internal generator, $E_g$, and internal resistance $R_g$ is coupled via a large coupling capacitor 11 to a feedback amplifier having an amplifier 12 whose nominal gain is $\mu$, and a feedback network 13, of feedback fraction $\beta$, connected directly between the output and input terminals of the amplifier 12. The input signal source and its associated wiring has an impedance looking back from capacitor 11 into the signal source of resistance $R_1$ including a resistance 14 shown connected between the source 10 and the capacitor 11. The resistance, $R_1-R_g$, of resistance 14 which in series with the internal resistance $R_g$ of the source 10 makes the total source impedance equal $R_1$. The output terminal of the amplifier is connected by means of an output capacitor 15 to the load 16.

When the nominal gain, $\mu$, of amplifier 12 is high the overall gain, $A_f$, for the prior art amplifier is shown to be, where the output impedance of the amplifier is neglected, $$A_f=\frac{E_{out}}{E_{in}}=\frac{-Z'}{Z_1}$$

by Millman and Taub on page 24 of their text "Pulse and Digital Circuits" published by the McGraw-Hill Book Company, Incorporated, 1956, where Z′ is the impedance of the feedback network and $Z_1$ is the impedance looking back into the source from the node 17 connecting capacitor 11 to amplifier 12 and feedback network 13.

Since the impedance looking back into the source is the series path comprising resistance $R_1$ and the capacitive reactance of capacitor 11, and the impedance of the feedback network 13 is $Z_f$ $$A_f=\frac{-Z_f}{R_1+\frac{1}{C_{in}S}}=\frac{-Z_f}{R_1\left(1+\frac{1}{R_1C_{in}S}\right)}=\frac{-Z_f}{R_1\left(1-j\frac{1}{R_1C_{in}\omega}\right)}$$

where $C_{in}$ is the capacitance of capacitor 11.

Since the gain is inversely proportional to the term $$\left(1-\frac{j}{R_1C_{in}\omega}\right)$$

the gain is directly proportional to the magnitude of the capacitance $C_{in}$, and for low values of frequency, $\omega C_{in}$ must be large in order to provide gain at such low frequencies. Capacitors as large as 300 microfarads have had to be employed in the prior art, and frequently the size and cost of these capacitors exceed that of the rest of the circuitry.

Figure 2:
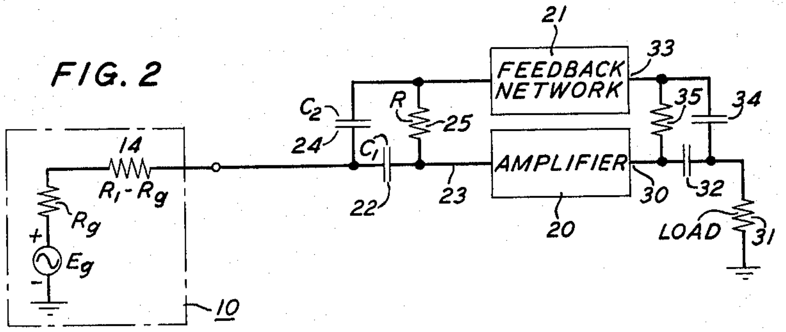
FIG. 2 is a block diagram of a negative feedback amplifier embodying the invention.

An amplifier which is capacitor coupled to both the signal source and the load and embodying this invention is shown in FIG. 2. In accordance with this invention the input signal source 10 is coupled to the amplifier 20, or active portion of the feedback loop, by means of a capacitor 22 and is coupled to the feedback network 21 by means of a capacitor 24. Where direct current feedback is desired in order to stabilize the bias voltages and currents in the amplifier a resistor 25 connected between the feedback network and the input terminal 23 of the amplifier 20 is employed. Similarly, in accordance with this invention the output terminal 30 of the amplifier is connected to the load 31 by means of a capacitor 32 and the terminal 33 of the feedback network is also connected to the load 31 by means of a capacitor 34. A resistor 35 connected directly between terminal 33 of the feedback network 21 and the output terminal 30 of amplifier 20 provides a path for the direct current feedback where such feedback is desired.

An intuitive grasp of the physics of the operation of a negative feedback amplifier embodying this invention may be obtained by realizing that, at the input side of the amplifier, for example, capacitors 22 and 24 are both connected in the feedback loop since the resistance of resistor 25 is high compared to the reactance of capacitor 24. Their combined reactance at low frequencies serves to decrease the feedback fraction, $\beta$, of the amplifier at low frequencies thus increasing the overall gain $A_f$ of the amplifier over what it would have been where the coupling capacitor is outside the feedback loop as shown in FIG. 1.

To mathematically prove that the gain is increased, assume that the capacitance of capacitors 22 and 24 are each equal to $C_{in}/2$, where $C_{in}$ is the capacitance of the coupling capacitor 11 in the prior art amplifier shown in FIG. 1. The overall gain of the amplifier shown in FIG. 2 is not easily determined but if the delta network comprising capacitors 22, 24 and resistor 25 is converted to the Y-configuration then the overall gain may be expressed as $$A_f = -Z'/Z_1$$

as taught by Millman and Taub on page 24 of the above mentioned text where Z' is the impedance of the passive portion of the feedback network and $Z_1$ is the impedance looking back toward the source from the common node of the Y-configuration.

Figure 3:
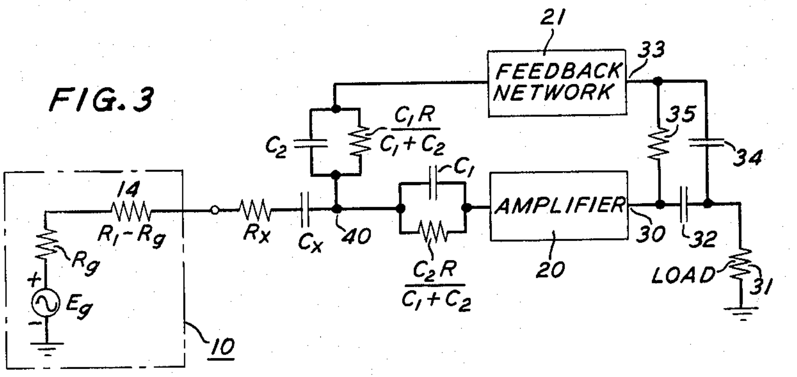
FIG. 3 is a block diagram of the negative feedback amplifier shown in FIG. 2 with the delta network input circuit converted to a Y-configuration.

The delta network is converted to a Y-network as taught on page 146 of "Alternating Current Circuits" by Kerchner and Corcoran, third edition, published by John Wiley & Sons, Incorporated, 1952, and the resulting amplifier circuit is shown in FIG. 3. A first branch of the Y-network consists of the series connection of a resistance $R_x$ and a capacitance $C_x$. A second branch comprises a capacitance $C_1$ in parallel with a resistance $$\frac{C_2R}{C_1+C_2}$$

The third branch comprises the parallel combination of a capacitance $C_2$ and a resistance $$\frac{C_1R}{C_1+C_2}$$

By following the conversion techniques in the above text $$R_x = \frac{-R}{R^2C_1C_2\omega^2 + \frac{(C_1+C_2)^2}{C_1C_2}}$$

and $$C_x = (C_1+C_2)\left[1 + \frac{R^2C_1^2C_2^2\omega^2}{(C_1+C_2)^2}\right]$$

Since $C_1 = C_2 = \frac{1}{2}C_{in} = C$ we may substitute the same value, C, for all values of capacitance. In addition the resistance of resistor 25 is related to the output resistance $R_1$ of the signal source by the following identity:

$R \equiv \alpha R_1$ where $\alpha$ is a dimensionless variable. Using this identity and the assumption that $C = C_1 = C_2$, the value of $R_x$ and $C_x$, respectively, become $$R_x = \frac{-\alpha R_1}{\alpha^2 k R_1^2 C^2 \omega^2 + \frac{(1+k)^2}{k}}$$

and $$C_x = (1+k)\left[1 + \frac{\alpha^2 k^2 R_1^2 C^2 \omega^2}{(1+k)^2 C^2}\right]C$$

Again, the overall gain of the resulting amplifier shown in FIG. 3 is $$A_f = -Z'/Z_1$$

where Z' is the impedance of the passive portion of the feedback network and $Z_1$ is the impedance looking back toward the source from the common node 40 of the resulting Y-configuration.

Z' is equal to the sum of $Z_f$, the impedance of the feedback network 21, the impedance of the branch of the Y-circuit comprising the parallel combination of the capacitance $C_1$ and the resistance $$\frac{C_1R}{C_1+C_2}$$

and the impedance of the branch of the Y-circuit comprising the parallel combination of the capacitance $C_1$ and resistance $$\frac{C_2R}{C_1+C_2}$$

Of these two latter impedances the former may be neglected since it is in all cases where high voltage gain is desired much smaller than the impedance of the feedback network, and the latter may be neglected since it has negligible effect on the gain where $\mu$ is high. The impedance $Z_1$ is equal to the sum of the resistances $R_1$, $R_x$ and the reactance of capacitor $C_x$. Thus $$Z_1 = R_1 + R_x \frac{1}{C_xS}$$

The external gain is therefore $$A_f = \frac{-Z_f}{R_1 + R_x + \frac{1}{C_xS}}$$

$$= \frac{-Z_f}{R_1\left(1 + \frac{R_x}{R_1}\right) + \frac{1}{R_1C_xS}}$$

$$A_f = \frac{-Z_f}{R_1}\left[\frac{1}{1 + \frac{R_x}{R_1} - j\frac{1}{R_1C_x\omega}}\right]$$

The ratio of the gain of the amplifier shown in FIG. 2 to that shown in FIG. 1 where $$C = C_2 = C_1 = \frac{C_{in}}{2}$$

is a figure of merit, M, for the amplifier and is:

$$M = \frac{R_1\left(1 - j\frac{1}{R_x2C\omega}\right)}{R_1\left[1 + \frac{R_x}{R_1} - \frac{j}{R_1C_x\omega}\right]}$$

At the frequency $\omega = 1/R_1C$ the gain of the prior art amplifier falls to .89 times its midfrequency gain. At the same frequency $$R_x = \frac{-\alpha k R_1}{\alpha^2 k^2 + (1+k)^2} = \frac{-\alpha R_1}{\alpha^2 + 4}$$

and if the total impedance $R_1$ is one-tenth the value of resistor 25 then $$R_x = \frac{-10}{104} R_1$$

For these same conditions $$C_x = (1+k)\left[1 + \frac{\alpha_2 k^2}{(1+k)^2}\right]C$$

$$C_x = 2\left(1 + \frac{\alpha^2}{k}\right)C = 42C = 25C_{in}$$

Thus the absolute magnitude of the figure of merit M at the frequency $$\omega = 1/R_1C$$

is $$M = \frac{1 - \frac{j}{2}}{\sqrt{\left(1 - \frac{10}{4}\right)^2 + \frac{j}{52}}} = \frac{1.11}{.90} = 1.22$$

Thus the amplifier shown in FIG. 2 has 1.22 times the gain at the frequency $\omega=1/R_1C$ as that shown in FIG. 1 where $$C_1=C_2=C=\frac{C_{in}}{2}$$

Figure 4:
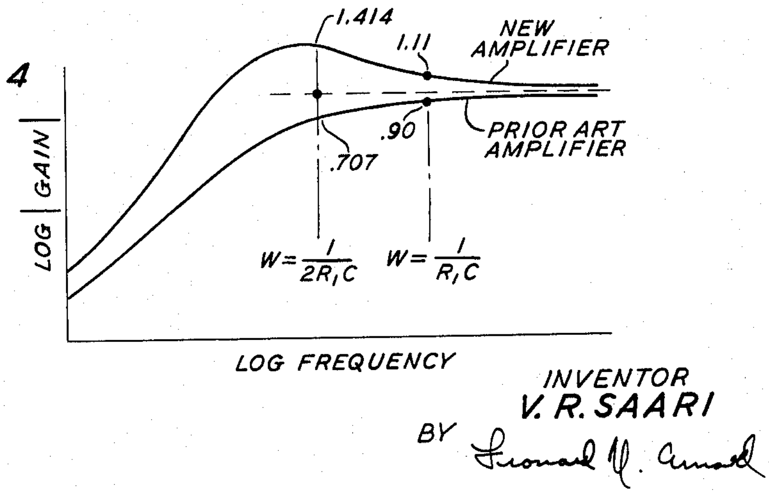
FIG. 4 shows the gain versus frequency curves of the prior art amplifier and an amplifier embodying this invention.

The gain is also greater for other low frequency values less than $\omega=1/R_1C$ as shown in FIG. 4 where the gain of the prior art amplifier and an amplifier built in accordance with this invention are plotted versus frequency.

Thus in accordance with this invention the gain of the amplifier is substantially increased at low frequencies where capacitors 22 and 24 have the same capacitance as capacitor 11. For example, at the frequency $\omega=1/R_1C$, where the gain of the prior art amplifier is reduced to .89 of its midband value the capacitance $C_x$, as shown above is 52 times $C_{in}$. Thus for a predetermined gain the value of the capacitances of capacitors 22 and 24 may be considerably less than $C_{in}/2$, and this not only reduces the physical size of the circuitry but substantially reduces its cost.

It should be emphasized that the resistors 25 and 35 are necessary only in the case where the feedback amplifier employs direct current feedback in order to provide bias stability. Where no direct current feedback is employed the resistors 25 and 35 may be omitted from the circuit and effective capacitance still is increased as demonstrated above. Finally, it may not always be necessary to block the flow of direct current from either the input or the output terminals with large capacitors. For example, in some instances the impedance looking into the load may be extremely high, for example, when the load is the input of a Klystron tube. In such instances, although there may still exist a necessity for direct current isolation the output terminal of amplifier 20 and the feedback network 21 may be connected to the load by means of relatively small capacitors. Sometimes there is no necessity for direct current isolation of the load and amplifier and they may be connected together without any capacitor, although it still may be necessary to block the flow of direct current between the signal source 10 and the amplifier. For this latter purpose capacitors 22 and 24 are employed as shown in FIG. 2 where only the signal source 10 and not the load 31 has to be capacitor coupled. Where only the load 31 has to be capacitor coupled to the amplifier capacitors 32 and 34 may be employed to increase the effective coupling capacitances, while the source 10 may be directly connected to the feedback network 21 and the input terminal of the amplifier.

It is to be understood that the above described arrangements are illustrative of the application of the principles of the invention. Numerous other arrangements may be devised by those skilled in the art without departing from the spirit and scope of the invention.

What is claimed is:

1. A negative feedback amplifier circuit comprising, in combination, an amplifier having an input and an output, a circuit input terminal and a circuit output terminal, a negative feedback network having two terminals, means connecting said amplifier input terminal and a first terminal of said negative feedback network to said circuit input terminal, a first capacitor directly connecting the second terminal of said feedback network to said circuit output terminal and a second capacitor directly connecting said amplifier output terminal to said circuit output terminal.

2. A negative feedback amplifier circuit comprising, in combination, an amplifier having an input and an output, a circuit input terminal and a circuit output terminal, a negative feedback network having two terminals, a first capacitor directly connecting said amplifier input terminal to said circuit input terminal, a second capacitor directly connecting a first terminal of said negative feedback network to said circuit input terminal, a third capacitor directly connecting said amplifier output to said circuit output terminal, and a fourth capacitor directly connecting the second terminal of said feedback network to said circuit output terminal.

3. A negative feedback amplifier circuit comprising, in combination, an amplifier having an input and an output, a circuit input terminal and a circuit output terminal, a negative feedback network having two terminals, a Δ network comprising a resistor, a first capacitor, and a second capacitor, means connecting the common junction of said resistor and said first capacitor of said Δ network to a first of said feedback network terminals, means connecting the common junction of said resistor and said second capacitor of said Δ network to said input of said amplifier, means connecting said circuit input terminal to the common junction of said capacitors of said Δ network, and means connecting the second terminal of said feedback network and said amplifier output to said circuit output terminal.

4. A negative feedback amplifier circuit comprising, in combination, an amplifier having an input and an output, a circuit input terminal and a circuit output terminal, a negative feedback network having two terminals, a Δ network comprising a resistor, a first capacitor, and a second capacitor, means connecting the common junction of said resistor and said first capacitor of said Δ network to a first of said feedback network terminals, means connecting the common junction of said resistor and said second capacitor of said Δ network to said output of said amplifier, means connecting said circuit output terminal to the common junction of said capacitors of said Δ network, and means connecting the second terminal of said feedback network and said amplifier input to said circuit input terminal.

5. A negative feedback amplifier circuit comprising, in combination, an amplifier having an input and an output, a circuit input terminal and a circuit output terminal, a negative feedback network having two terminals, a pair of Δ networks each comprising a resistor, a first capacitor and a second capacitor, means connecting the common junction of said resistor and said first capacitor of a first of said Δ networks to a first terminal of said feedback network, means connecting the common junction of said resistor and said second capacitor of said first Δ network to said input of said amplifier, means connecting said circuit input terminal to the common junction of said capacitors of said first Δ network, means connecting the common junction of said first capacitor and said resistor of the second Δ network to the second terminal of said feedback network, means connecting the common junction of said resistor and said second capacitor of said second Δ network to said output of said amplifier, and means connecting the common junction of said capacitors of said second Δ network to said circuit output terminal.

6. A negative feedback amplifier circuit comprising, in combination, an amplifier having an input terminal, an output terminal, a negative feedback network having two terminals, a source of input signals to be amplified over a range of input signal frequencies extending upward in frequency from substantially zero frequency, a pair of Δ network each comprising a resistor, a first capacitor, and a second capacitor, means connecting the common junction of said resistor and said first capacitor of a first of said Δ networks to a first of said feedback network terminals, means connecting the common junction of said resistor and said second capacitor of said first Δ network to said input terminals of said amplifier, means connecting said source of input signals to the common junction of said capacitors of said first Δ network, means connecting the common junction of said first capacitor and said resistor of the second Δ network to the second of said feedback network terminals, means connecting the common junction of said resistor and said second capacitor of said second Δ network to said output terminal of said amplifier, a load, and means connecting said load to the common junction of said capacitors of said second Δ network.

References Cited by the Examiner

UNITED STATES PATENTS

| | | | |
|---|---|---|---|
| 2,544,344 | 3/1951 | Minner | 330—91 |

OTHER REFERENCES

Ghausi and Pederson, "A New Design Approach for Feedback Amplifiers," IRE Transactions on Circuit Theory, September 1961, pages 274–283.

ROY LAKE, *Primary Examiner.*

R. P. KANANEN, *Assistant Examiner.*